United States Patent
Triyoso et al.

(10) Patent No.: US 8,383,473 B1
(45) Date of Patent: Feb. 26, 2013

(54) METHODS OF FORMING REPLACEMENT GATE STRUCTURES FOR SEMICONDUCTOR DEVICES

(75) Inventors: Dina Triyoso, Dresden (DE); Hao Zhang, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/445,547

(22) Filed: Apr. 12, 2012

(51) Int. Cl.
*H01L 21/336* (2006.01)

(52) U.S. Cl. .. 438/197; 438/585; 438/592; 257/E21.444

(58) Field of Classification Search ............... 438/197, 438/585, 591, 592; 257/288, E21.409, E21.444
See application file for complete search history.

(56) References Cited

U.S. PATENT DOCUMENTS

| | | | |
|---|---|---|---|
| 6,380,088 B1 | 4/2002 | Chan et al. | |
| 6,607,950 B2 | 8/2003 | Henson et al. | |
| 6,921,711 B2 | 7/2005 | Cabral, Jr. et al. | |
| 7,390,709 B2 * | 6/2008 | Doczy et al. | 438/199 |
| 7,781,321 B2 * | 8/2010 | Gambino et al. | 438/587 |
| 7,951,677 B2 | 5/2011 | Heinrich et al. | |
| 7,981,740 B2 * | 7/2011 | Lenski et al. | 438/229 |
| 8,084,311 B1 | 12/2011 | Horak et al. | |
| 2010/0133628 A1 * | 6/2010 | Frohberg et al. | 257/410 |
| 2010/0244141 A1 | 9/2010 | Beyer et al. | |
| 2010/0301427 A1 | 12/2010 | Lenski et al. | |
| 2010/0330808 A1 | 12/2010 | Richter et al. | |
| 2012/0104469 A1 * | 5/2012 | Li et al. | 257/288 |

\* cited by examiner

*Primary Examiner* — Tuan N. Quach

(74) *Attorney, Agent, or Firm* — Williams, Morgan & Amerson, P.C.

(57) ABSTRACT

Disclosed herein are various methods of forming replacement gate structures for semiconductor devices. In one example, the method includes forming a sacrificial gate structure above a semiconducting substrate, removing the sacrificial gate structure to thereby define a gate cavity for a replacement gate structure, forming a gate insulation layer in the gate cavity and forming a layer of metal above the gate insulation layer. In this example, the method also includes forming a patterned etch mask layer above the metal layer that exposes substantially vertically oriented portions of the metal layer within the cavity and covers a substantially horizontally oriented portion of the metal layer within the cavity, performing an etching process through the patterned etch mask layer to reduce a thickness of the exposed substantially vertically oriented portions of the metal layer and removing the patterned etch mask layer.

22 Claims, 6 Drawing Sheets

METHODS OF FORMING REPLACEMENT GATE STRUCTURES FOR SEMICONDUCTOR DEVICES

BACKGROUND OF THE INVENTION

1. Field of the Invention

Generally, the present disclosure relates to the manufacture of sophisticated semiconductor devices, and, more specifically, to various methods of forming replacement gate structures for semiconductor devices.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein field effect transistors (NFET and PFET transistors) represent one important type of circuit element used in manufacturing such integrated circuit devices. A field effect transistor, irrespective of whether an NFET transistor or a PFET transistor is considered, typically comprises doped source and drain regions that are formed in a semiconducting substrate that are separated by a channel region. A gate insulation layer is positioned above the channel region and a conductive gate electrode is positioned above the gate insulation layer. By applying an appropriate voltage to the gate electrode, the channel region becomes conductive and current is allowed to flow from the source region to the drain region.

For many early device technology generations, the gate electrode structures of most transistor elements have comprised a plurality of silicon-based materials, such as a silicon dioxide and/or silicon oxynitride gate insulation layer, in combination with a polysilicon gate electrode. However, as the channel length of aggressively scaled transistor elements has become increasingly smaller, many newer generation devices employ gate electrode stacks comprising alternative materials in an effort to avoid the short channel effects which may be associated with the use of traditional silicon-based materials in reduced channel length transistors. For example, in some aggressively scaled transistor elements, which may have channel lengths on the order of approximately 14-32 nm, gate electrode stacks comprising a so-called high-k dielectric/metal gate (HK/MG) configuration have been shown to provide significantly enhanced operational characteristics over the heretofore more commonly used silicon dioxide/polysilicon (SiO/poly) configurations. These metal gate electrode materials may include, for example, one or more layers of titanium (Ti), titanium nitride (TiN), titanium-aluminum (TiAl), aluminum (Al), aluminum nitride (AlN), tantalum (Ta), tantalum nitride (TaN), tantalum carbide (TaC), tantalum carbonitride (TaCN), tantalum silicon nitride (TaSiN), tantalum silicide (TaSi) and the like.

Figure 1A:
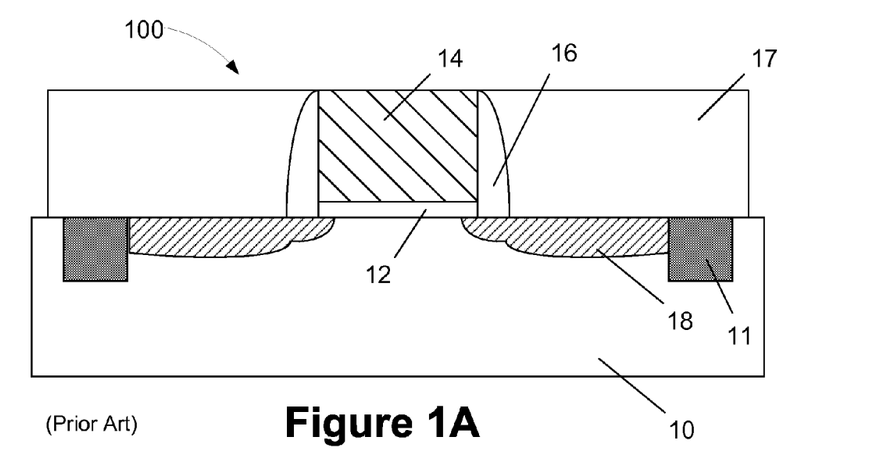
FIGS. 1A-1D depict one illustrative prior art process flow for forming a semiconductor device using a gate last approach.

One well-known processing method that has been used for forming a transistor with a high-k/metal gate structure is the so-called "gate last" or "replacement gate" technique. FIGS. 1A-1D depict one illustrative prior art method for forming a HK/MG replacement gate structure using a gate last technique. As shown in FIG. 1A, the process includes the formation of a basic transistor structure 100 above a semiconducting substrate 10 in an active area defined by a shallow trench isolation structure 11. At the point of fabrication depicted in FIG. 1A, the device 100 includes a sacrificial gate insulation layer 12, a dummy or sacrificial gate electrode 14, sidewall spacers 16, a layer of insulating material 17 and source/drain regions 18 formed in the substrate 10. The various components and structures of the device 100 may be formed using a variety of different materials and by performing a variety of known techniques. For example, the sacrificial gate insulation layer 12 may be comprised of silicon dioxide, the sacrificial gate electrode 14 may be comprised of polysilicon, the sidewall spacers 16 may be comprised of silicon nitride and the layer of insulating material 17 may be comprised of silicon dioxide. The source/drain regions 18 may be comprised of implanted dopant materials (N-type dopants for NFET devices and P-type dopants for PFET devices) that are implanted into the substrate 10 using known masking and ion implantation techniques. Of course, those skilled in the art will recognize that there are other features of the transistor 100 that are not depicted in the drawings for purposes of clarity. For example, so-called halo implant regions are not depicted in the drawings, as well as various layers or regions of silicon/germanium that are typically found in high-performance PFET transistors. At the point of fabrication depicted in FIG. 1A, the various structures of the device 100 have been formed and a chemical mechanical polishing process (CMP) has been performed to remove any materials above the sacrificial gate electrode 14 (such as a protective cap layer (not shown) comprised of silicon nitride) so that the sacrificial gate electrode 14 may be removed.

Figure 1B:
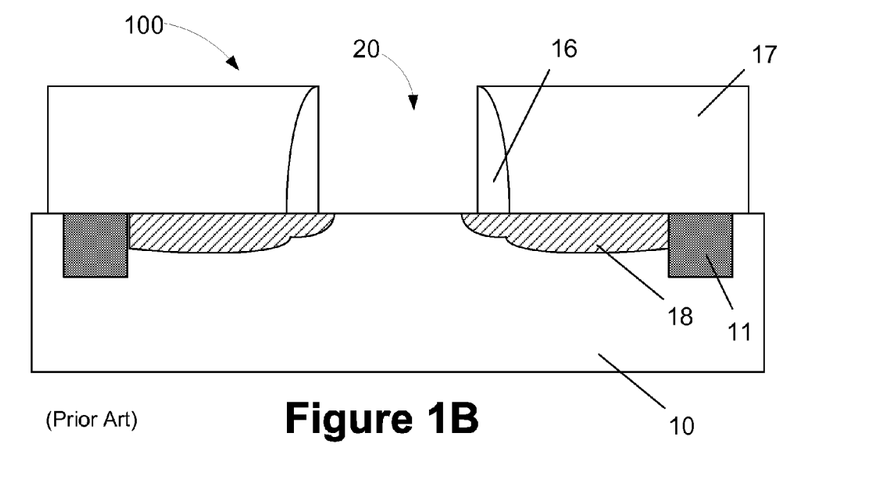

As shown in FIG. 1B, one or more etching processes are performed to remove the sacrificial gate electrode 14 and the sacrificial gate insulation layer 12 to thereby define a gate opening or cavity 20 where a replacement gate structure will be subsequently formed. A masking layer that is typically used in such etching processes is not depicted for purposes of clarity. Typically, the sacrificial gate insulation layer 12 is removed as part of the replacement gate technique, as depicted herein. However, the sacrificial gate insulation layer 12 may not be removed in all applications.

Figure 1C:
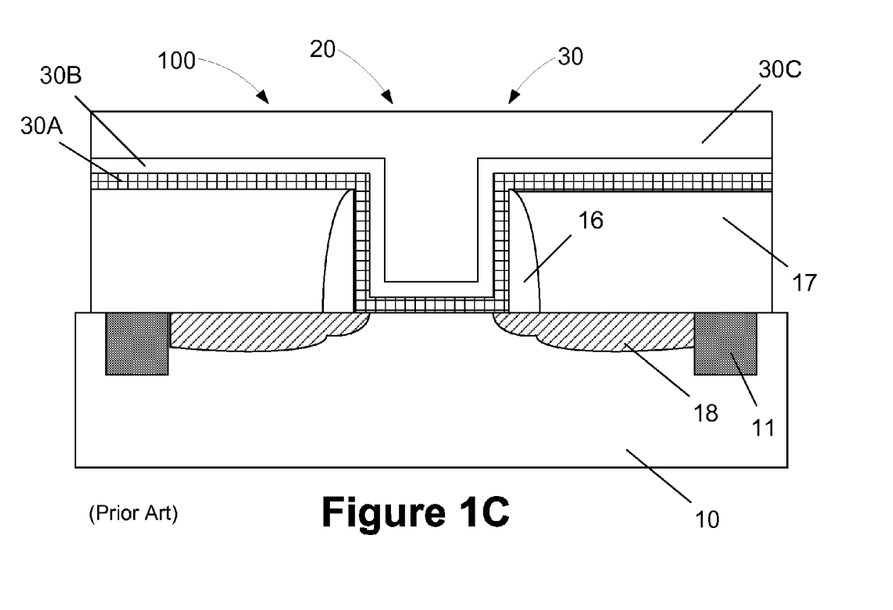
Figure 1D:
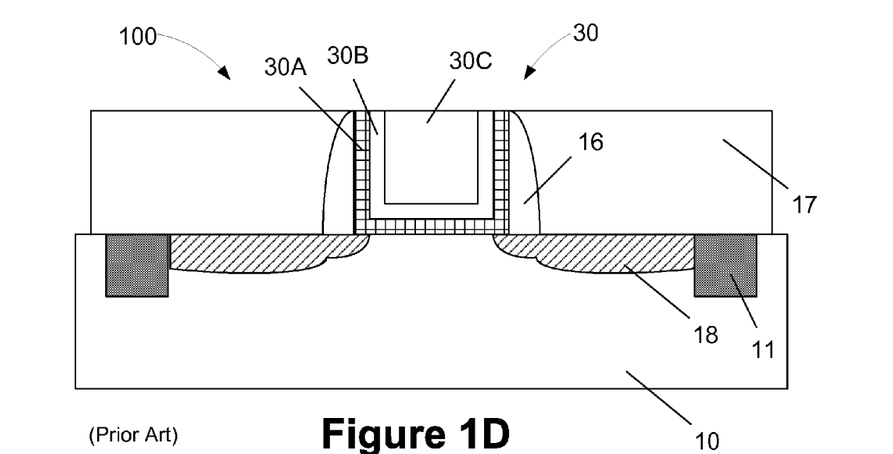

Next, as shown in FIG. 1C, various layers of material that will constitute a replacement gate structure 30 are formed in the gate opening 20. However, although not depicted in the drawings, the generally square-edged gate opening may cause certain problems in forming such layers of material in the gate opening 20. For example, such a square-edged gate opening 20 may lead to the formation of voids in one or more of the layers of material that will be formed in the gate opening 20. In one illustrative example, the replacement gate structure 30 is comprised of a high-k gate insulation layer 30A having a thickness of approximately 2 nm, a work function adjusting layer 30B comprised of a metal (e.g., a layer of titanium nitride with a thickness of 2-5 nm) and a bulk metal layer 30C (e.g., aluminum). Ultimately, as shown in FIG. 1D, a CMP process is performed to remove excess portions of the gate insulation layer 30A, the work function adjusting layer 30B and the bulk metal layer 30C positioned outside of the gate opening 20 to define the replacement gate structure 30.

As device dimensions have decreased, the size of the gate cavity 20 has also been reduced. For example, in current-day advanced devices, the size (critical dimension) of the gate cavity 20 may only be about 20-30 nm, and further reductions in the size of the gate cavity 20 are anticipated as newer generations of devices are introduced. Thus, reliably filling such small-size gate cavities 20 with the various materials that are used to form the replacement gate structure 30 is becoming more challenging. Additionally, in some applications, plasma-based deposition processes, such as plasma-enhanced physical vapor deposition (PEPVD) or plasma-enhanced chemical vapor deposition (PECVD) processes are performed to form one or more of the layers of material that will become part of the replacement gate structure. However, the use of such plasma-based processes can have detrimental effects on other portions of a transistor device, such as the gate insulation layer, the substrate itself, etc., due to ion bombardment during such plasma-based processes. In some cases, such plasma-induced damage may cause the final transistor device to operate at reduced performance levels.

The present disclosure is directed to various, more efficient methods of forming replacement gate structures for semiconductor devices that may at least reduce or eliminate one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming replacement gate structures for semiconductor devices. In one example, the method includes forming a sacrificial gate structure above a semiconducting substrate, removing the sacrificial gate structure to thereby define a gate cavity for a replacement gate structure, forming a gate insulation layer in the gate cavity and forming a layer of metal above the gate insulation layer. In this example, the method also includes forming a patterned etch mask layer above the metal layer that exposes substantially vertically oriented portions of the metal layer within the cavity and covers a substantially horizontally oriented portion of the metal layer within the cavity, performing an etching process through the patterned etch mask layer to reduce a thickness of the exposed substantially vertically oriented portions of the metal layer and removing the patterned etch mask layer.

Another illustrative method disclosed herein includes the steps of forming a sacrificial gate structure above a semiconducting substrate, removing the sacrificial gate structure to thereby define a gate cavity for a replacement gate structure, depositing a high-k gate insulation layer in the gate cavity and performing an atomic layer deposition (ALD) process to form a layer of metal above the high-k gate insulation layer. In this example, the method also includes forming a layer of etch mask material on the layer of metal such that an as-deposited thickness of a substantially horizontally oriented portion of the layer of etch mask material that is positioned above a bottom of the gate cavity is greater than an as-deposited thickness of substantially vertically oriented portions of the layer of etch mask material positioned adjacent the substantially vertically oriented portions of the metal layer, performing a first wet etching process to remove at least portions of the substantially vertically oriented portions of the layer of etch mask material to thereby form a patterned etch mask layer above the metal layer that exposes substantially vertically oriented portions of the metal layer within the cavity and covers a substantially horizontally oriented portion of the metal layer within the cavity, performing a second wet etching process through the patterned etch mask layer to reduce a thickness of the exposed substantially vertically oriented portions of the metal layer such that a post-etch thickness of the substantially vertically oriented portions of the metal layer is less than an as-deposited thickness of the horizontally oriented portion of the metal layer, performing a third wet etching process to remove the patterned etch mask layer and forming a conductive material in unfilled portions of the cavity.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming replacement gate structures for semiconductor devices using a novel etching protocol. As will be readily apparent to those skilled in the art upon a complete reading of the present application, the various methods disclosed herein may be employed with a variety of technologies, e.g., NFET, PFET, CMOS, etc., and they may be readily employed in manufacturing a variety of integrated circuit devices, including, but not limited to, ASICs, logic devices, memory devices, etc. With reference to FIGS. 2A-2G, various illustrative embodiments of the various methods disclosed herein will now be described in more detail.

Figure 2A:
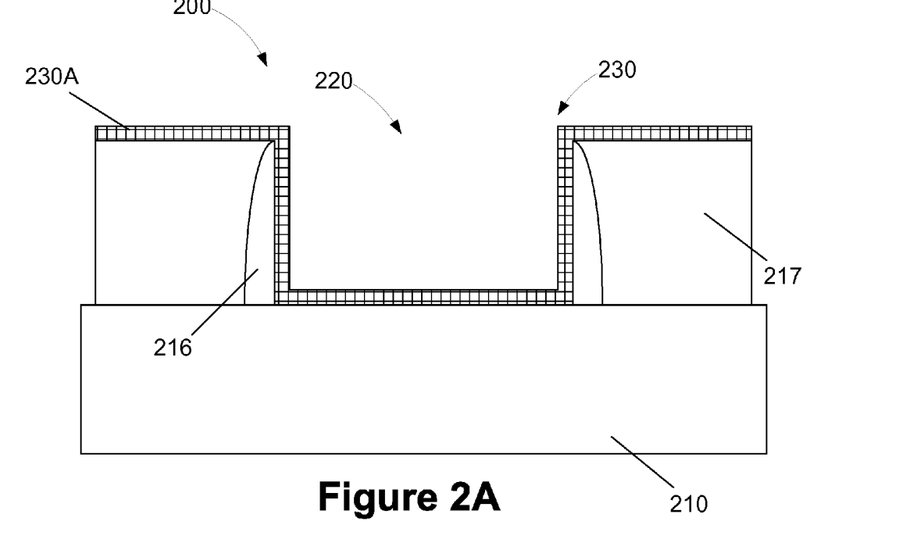
FIGS. 2A-2G depict various illustrative examples of forming replacement gate structures using the illustrative methods disclosed herein.

FIG. 2A is a simplified view of an illustrative transistor 200 at an early stage of manufacturing. The transistor 200 may be either an NFET transistor or a PFET transistor. The transistor 200 is formed in and above an active region defined by isolation structures (not shown) formed in a semiconducting substrate 210. The substrate 210 may have a variety of configurations, such as the depicted bulk silicon configuration. The substrate 210 may also have a silicon-on-insulator (SOI) configuration that includes a bulk silicon layer, a buried insulation layer and an active layer, wherein semiconductor devices are formed in and above the active layer. Thus, the terms substrate or semiconductor substrate should be understood to cover all forms of semiconductor structures. The substrate 210 may also be made of materials other than silicon.

FIG. 2A depicts the transistor 200 at a point of fabrication that roughly corresponds to the point of fabrication depicted for the illustrative prior art transistor 100 shown in FIG. 1B. That is, a gate cavity 220 has been formed by removing a sacrificial gate structure (not shown) which typically includes a sacrificial gate insulation layer and a dummy or sacrificial gate electrode. In this illustrative example, the gate cavity 220 is defined by sidewall spacers 216 that are positioned in a layer of insulating material 217. At this point in the fabrication process, source/drain regions (not shown) and halo-implant regions (not shown) would have already been formed in the substrate 210. The source/drain regions may be comprised of implanted dopant materials (N-type dopants for NFET devices and P-type dopants for PFET devices) that are implanted into the substrate 210 using known masking and ion implantation techniques. The various methods disclosed herein may be employed on transistors that have a variety of different materials and with any type of sacrificial gate structure. For example, the sacrificial gate insulation layer may be comprised of silicon dioxide, the sacrificial gate electrode may be comprised of polysilicon, the sidewall spacers 216 may be comprised of silicon nitride and the layer of insulating material 217 may be comprised of silicon dioxide. The various structures noted above have been omitted from the drawing for purposes of clarity and to facilitate disclosure of the present inventions.

After the gate cavity 220 is formed by removing the sacrificial gate structure, the various layers of material that will constitute a replacement gate structure 230 are formed in the gate cavity 220. As shown in FIG. 2A, in one illustrative example, the replacement gate structure 230 is comprised of an insulating layer 230A, such as a high-k gate insulation layer 230A having a thickness of approximately 2 nm. The illustrative high-k gate insulation layer 230A may be formed by performing, for example, a conformable chemical vapor deposition (CVD) process. The high-k gate insulation layer 230A may be comprised of a variety of materials having a k value greater than 10, e.g., tantalum oxide ($Ta_2O_5$), hafnium oxide ($HfO_2$), zirconium oxide ($ZrO_2$), titanium oxide ($TiO_2$), aluminum oxide ($Al_2O_3$), hafnium silicates ($HfSiO_x$) and the like.

Figure 2B:
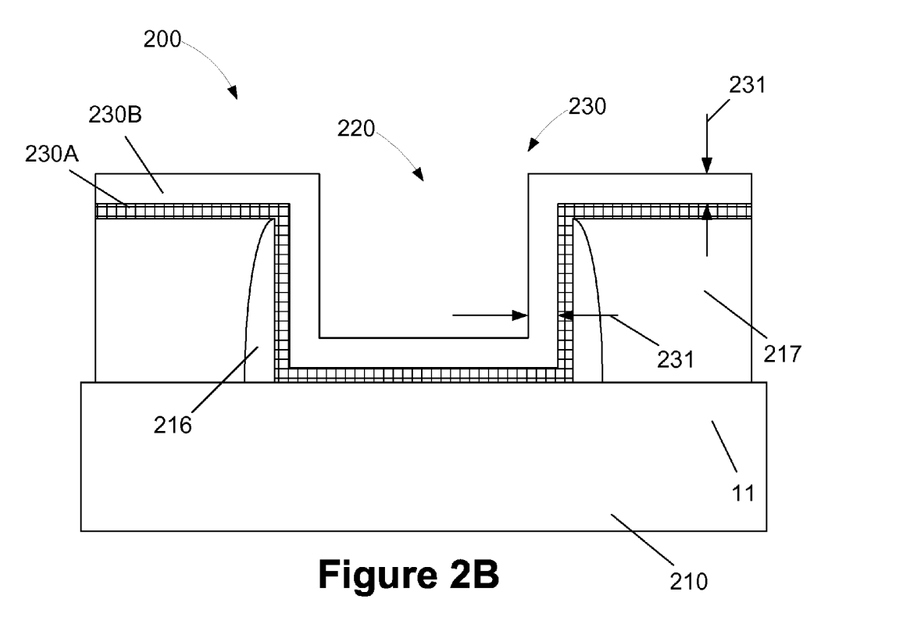

Next, as shown in FIG. 2B, a metal layer 230B is formed in the gate cavity 220 above the high-k gate insulation layer 230A. In one illustrative embodiment, the metal layer 230B is a work function adjusting layer that may be comprised of a variety of different materials such as, for example, titanium (Ti), titanium nitride (TiN), titanium-aluminum (TiAl), aluminum (Al), aluminum nitride (AlN), tantalum (Ta), tantalum nitride (TaN), tantalum carbide (TaC), tantalum carbonitride (TaCN), tantalum silicon nitride (TaSiN), tantalum silicide (TaSi) and the like. In some applications, there may be more than one metal layer formed in the cavity 220 for a particular device. In that situation, the methods discussed more fully below may be applied to each metal layer if desired. The layer of metal 230B may be formed by a variety of techniques. In one illustrative example, the metal layer 230B may be formed by a thermal-based process, such as an atomic layer deposition (ALD) process or a thermal CVD process, etc. In one illustrative example, the metal layer 230B may be a layer of titanium nitride with an as-deposited thickness 231 of about 4-5 nm that is performed by performing an ALD process at a deposition temperature of about 100-400° C. In one illustrative embodiment, the as-deposited thickness 231 of the metal layer 230B may be substantially uniform, as depicted in FIG. 2B. As will be recognized by those skilled in the art after a complete reading of the present application, the insulating materials and the metal layer(s) that are part of the replacement gate structure 230 may be of any desired construction and comprised of any of a variety of different materials. Additionally, the replacement gate structure 230 for an NFET device may have different material combinations as compared to a replacement gate structure 230 for a PFET device. Thus, the particular details of construction of the replacement gate structure 230, and the manner in which such replacement gate structure 230 is formed, should not be considered a limitation of the present invention unless such limitations are expressly recited in the attached claims. The methods disclosed herein may also employ replacement gate structures 230 that do not employ a high-k gate insulation layer; although a high-k gate insulation layer will likely be used in most applications.

Figure 2C:
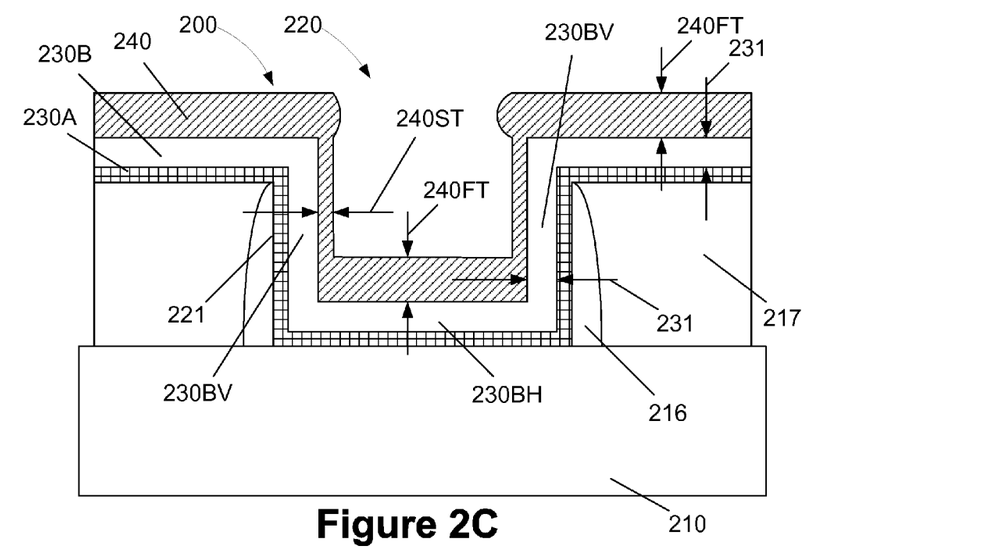

Next, as shown in FIG. 2C an etch mask material layer 240 is deposited on the device 200 and in the cavity 220 above the metal layer 230B. In general, the etch mask material layer 240 may be made of any material that may be selectively etched with respect to the metal layer 230B and one that may be deposited such that the etch mask material layer 240 has an as-deposited thickness profile wherein it has a greater thickness on substantially horizontal surfaces than it does on substantially vertical surfaces. More specifically, in one illustrative embodiment, the etch mask material layer 240 has an as-deposited thickness profile wherein its bottom thickness 240FT in the bottom of the cavity 220 above the substantially horizontal portion 230BH of the metal layer 230B is greater than its sidewall thickness 240ST above the substantially vertically oriented portions 230BV of the metal layer 230B positioned adjacent the sidewalls 221 of the gate cavity 220. In some embodiments, the thickness 240FT may be substantially uniform on all of the substantially horizontal surfaces, as depicted in FIG. 2C. In one illustrative example, the sidewall thickness 240ST of the etch mask material layer 240 may be approximately one-half the thickness 240FT of the etch mask material layer 240 above the bottom of the cavity 220. The etch mask material layer 240 may be comprised of materials such as, for example, silicon, silicon dioxide, silicon nitride, hafnium oxides, hafnium nitrides, any high-k oxides or any other dielectric materials which have acceptable wet etch selectivity against metal, etc., and it may be formed by performing a variety of techniques, e.g., a physical vapor deposition (PVD) process or a thermal-based process, such as a CVD or ALD process. In one illustrative embodiment, the as-deposited thickness 240FT of the etch mask material layer 240 may be about 3-5 nm. As used herein and in the claims, the reference to phrases such as "substantially vertically oriented portions," "substantially horizontally oriented portions" or similar phrases to describe various portions or regions of a layer of material are not to be interpreted as implying any sort of geometric precision. Those skilled in the art having benefit of the present disclosure will readily understand that the fabrication of integrated circuit devices does not lend itself to the formation of geometrically precise layers of material.

Figure 2D:
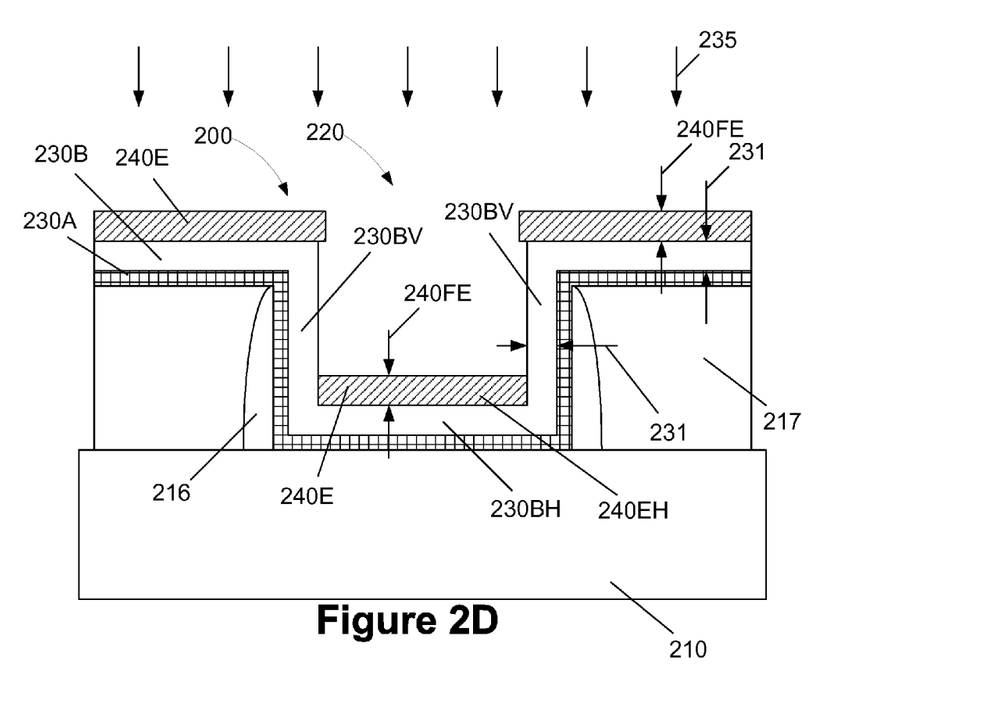

Then, as shown in FIG. 2D, a wet etching process 235 is performed to remove the portions of the etch mask material layer 240 positioned above the substantially vertically oriented portions surfaces 230BV of the metal layer 230B. The wet etching process 235 results in the definition of a patterned etch mask 240E. As depicted in FIG. 2D, the remaining regions of the patterned etch mask 240E that are positioned on substantially horizontal surfaces, such as the substantially horizontal portion 230BH of the metal layer 230B, has a reduced, post-etch thickness 240FE. The post-etch thickness 240FE of the substantially horizontal portion 240EH of the patterned etch mask 240E positioned at the bottom of the cavity 220 is less than the as-deposited thickness 240FT of the etch mask material layer 240 (FIG. 2C). In one illustrative embodiment, the post-etch thickness 240FE may be about 1-3 nm. Importantly, the patterned etch mask 240E exposes the substantially vertically oriented portions 230BV of the metal layer 230B for further processing, while the substantially horizontal portion 240EH of the patterned etch mask 240E positioned at the bottom of the cavity 220 above the metal layer 230B remains in place to protect the substantially horizontal portion 230BH of the metal layer 230B during a subsequent etch process that will be described more fully below. The wet etching process 235 may be a timed etch process to insure that a sufficient amount of the material of the patterned etch mask 240E remains in the bottom of the cavity 220 above the metal layer 230B.

Figure 2E:
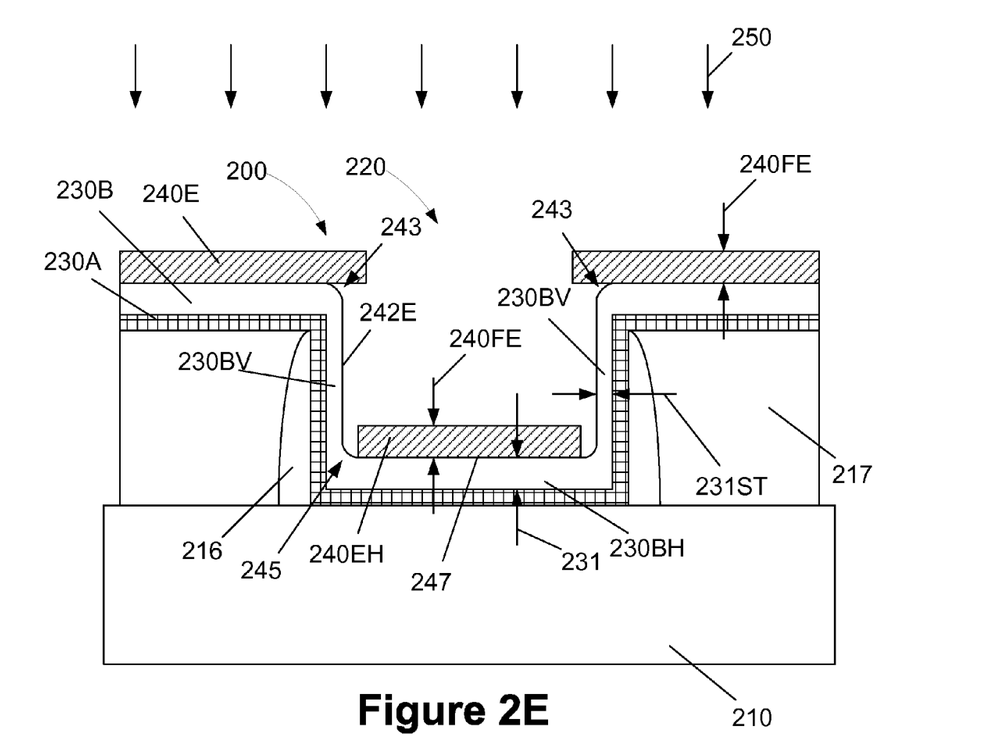

Next, as shown in FIG. 2E, a wet etching process 250 is performed through the patterned etch mask 240E to remove at least a portion of the original as-deposited sidewall thickness 231 of the substantially vertically oriented portions 230BV of the metal layer 230B. This results in at least portions of the substantially vertically oriented portions 230BV of the metal layer 230B having a post-etch thickness 231ST that is less than the original as-deposited sidewall thickness 231. In one illustrative embodiment, the post-etch thickness 231ST may be about one-half (or less) of the original as-deposited sidewall thickness 231. In terms of absolute numbers, the post-etch thickness 231ST may be about 1-2 nm depending upon the particular application. The wet etching process 250 results in the remaining substantially vertically oriented portions 230BV of the metal layer 230B having an etched surface 242E, while the substantially horizontal portion 230BH of the metal layer 230B still has its as-deposited surface 247, since it is protected during the etching process 250 by the substantially horizontal portion 240EH of the patterned etch mask 240E positioned at the bottom of the cavity 220. As noted previously, to the extent that the ultimate replacement gate electrode 230 for the device 200 includes multiple layers of metal, such as multiple layers of work function metals commonly found in PFET transistors, the methods disclosed herein as it relates to reducing the thickness of the vertically oriented portions 230BV of such a metal layer herein may be employed on each of the layers of metal, if desired.

With continuing reference to FIG. 2E, the wet etching process 250 also tends to round the upper corners of the metal layer 230B, as reflected by the arrow 243, and may produce some corner rounding at the bottom of the cavity 220, as reflected by the arrow 245. In addition to any corner rounding that may be present due to the characteristics of the deposition process that was performed to form the metal layer 230B, the additional corner rounding 243 resulting from performing the wet etching process 250 may be very helpful in subsequent processing operations that will be performed to fill the remaining portions of the gate cavity 220 with a conductive material. After the wet etching process 250 is performed, the remaining portions of the patterned etch mask 240E may be removed by performing another wet etching process similar to the etch process 235 described above.

Figure 2F:
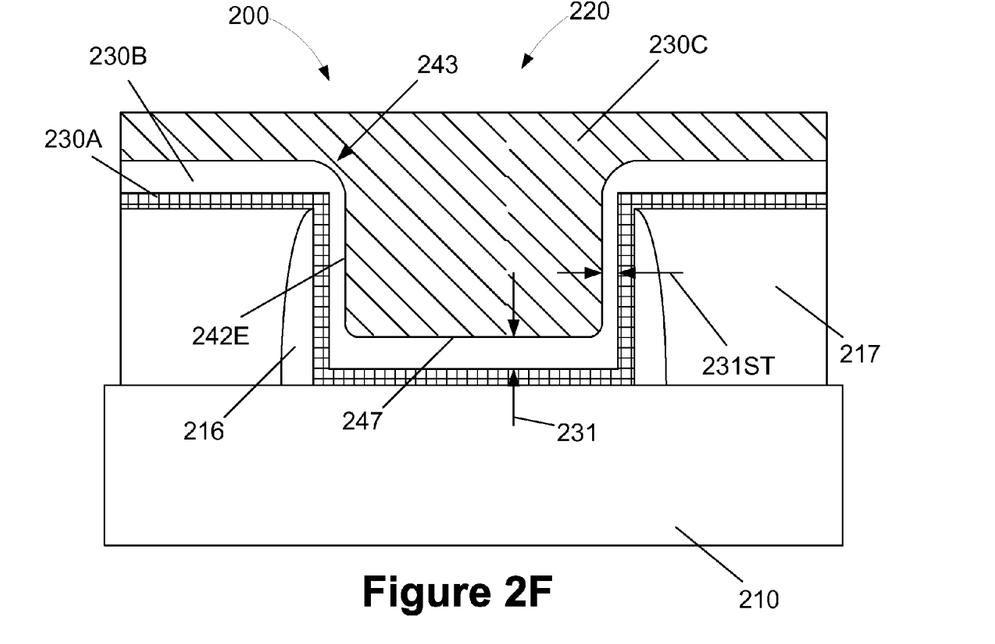

Next, as shown in FIG. 2F, one or more process operations are performed to form a conductive material 230C that overfills the remaining portions of the cavity 220. The conductive material 230C may be comprised of a variety of different materials, e.g., aluminum, titanium, copper, etc., and it may be formed using a variety of known techniques. In one illustrative embodiment, the conductive material 230C is comprised of aluminum and it is formed by performing a PVD process.

Figure 2G:
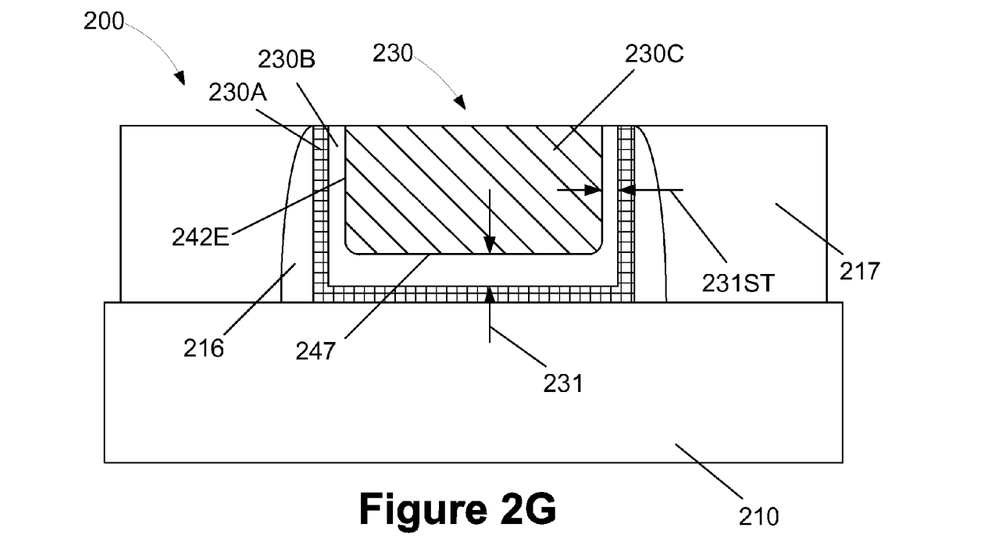

Then, as shown in FIG. 2G, one or more chemical mechanical polishing (CMP) processes are performed to remove excess portions of the gate insulation layer 230A, the metal work function adjusting layer 230B and the conductive material 230C positioned outside of the gate cavity 220 to thereby define the replacement gate structure 230. At the point depicted in FIG. 2G, additional processing operations may be performed to complete the formation of the transistor 200, such as the formation of metal silicide regions (not shown) on the source/drain regions (not shown), the formation of conductive contacts (not shown) to the source/drain regions and the formation of multiple metallization layers (not shown) above the transistor 200 using known techniques. Of course, the total number of metallization layers may vary depending on the particular device under construction.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a transistor, comprising:
    forming a sacrificial gate structure above a semiconducting substrate;
    removing said sacrificial gate structure to thereby define a gate cavity for a replacement gate structure;
    forming a gate insulation layer in said gate cavity;
    forming a metal layer above said gate insulation layer;
    forming a patterned etch mask layer above said metal layer, said patterned etch mask layer exposing substantially vertically oriented portions of said metal layer within said cavity and covering a substantially horizontally oriented portion of said metal layer within said cavity;
    performing an etching process through the patterned etch mask layer to reduce a thickness of said exposed substantially vertically oriented portions of said metal layer; and
    removing said patterned etch mask layer.

2. The method of claim 1, further comprising forming a conductive material in unfilled portions of said gate cavity.

3. The method of claim 2, wherein said conductive material is comprised of at least one of copper, aluminum or titanium.

4. The method of claim 1, wherein said gate insulation layer is a high-k insulating material and wherein said metal layer is comprised of at least one of titanium (Ti), titanium-nitride (TiN), titanium-aluminum (TiAl), aluminum (Al), aluminum nitride (AlN), tantalum (Ta), tantalum nitride (TaN), tantalum carbide (TaC), tantalum carbonitride (TaCN), tantalum silicon nitride (TaSiN) or tantalum silicide.

5. The method of claim 1, wherein forming said patterned etch mask layer above said metal layer comprises:
   forming a layer of etch mask material on said metal layer such that an as-deposited thickness of a substantially horizontally oriented portion of said layer of etch mask material that is positioned above a bottom of said gate cavity is greater than an as-deposited thickness of substantially vertically oriented portions of said layer of etch mask material positioned adjacent said substantially vertically oriented portions of said metal layer within said gate cavity; and
   performing a wet etching process to remove at least portions of said substantially vertically oriented portions of said layer of etch mask material.

6. The method of claim 2, further comprising performing at least one chemical mechanical polishing process to remove portions of said gate insulation layer, said metal layer and said conductive material to thereby define said replacement gate structure.

7. The method of claim 1, wherein said sacrificial gate structure is comprised of a sacrificial gate insulation layer comprised of silicon dioxide and a sacrificial gate electrode comprised of polysilicon.

8. The method of claim 1, wherein forming said metal layer comprises performing a thermal deposition process to form said metal layer.

9. The method of claim 1, wherein forming said metal layer comprises performing an atomic layer deposition (ALD) process to form said metal layer.

10. The method of claim 1, wherein said metal layer has an as-deposited thickness and wherein, after said etching process is performed, said exposed substantially vertically oriented portions of said metal layer has a post-etch thickness that is less than said as-deposited thickness.

11. The method of claim 1, wherein said metal layer has an as-deposited thickness and wherein, after said etching process is performed, said exposed substantially vertically oriented portions of said metal layer has a post-etch thickness that is 50% or less of said as-deposited thickness.

12. The method of claim 1, wherein said metal layer has an as-deposited thickness that falls within the range of about 4-5 nm, and wherein, after said etching process is performed, said exposed substantially vertically oriented portions of said metal layer has a post-etch thickness that is within the range of about 1-2 nm.

13. A method of forming a transistor, comprising:
   forming a sacrificial gate structure above a semiconducting substrate;
   removing said sacrificial gate structure to thereby define a gate cavity for a replacement gate structure;
   forming a high-k gate insulation layer in said gate cavity;
   performing a thermal deposition process to form a metal layer above said high-k gate insulation layer;
   forming a patterned etch mask layer above said metal layer, said patterned etch mask layer exposing substantially vertically oriented portions of said metal layer within said gate cavity and covering a substantially horizontally oriented portion of said metal layer that is positioned within said gate cavity;
   performing an etching process through the patterned etch mask layer to reduce a thickness of said exposed substantially vertically oriented portions of said metal layer;
   removing said patterned etch mask layer; and
   forming a conductive material in unfilled portions of said gate cavity.

14. The method of claim 13, further comprising performing at least one chemical mechanical polishing process to remove portions of said gate insulation layer, said metal layer and said conductive material to thereby define said replacement gate structure.

15. The method of claim 13, wherein performing said thermal deposition process to form said metal layer comprises performing an atomic layer deposition (ALD) process to form said metal layer.

16. The method of claim 13, wherein said metal layer has an as-deposited thickness and wherein, after said etching process is performed, said exposed substantially vertically oriented portions of said metal layer has a post-etch thickness that is less than said as-deposited thickness.

17. The method of claim 13, wherein said metal layer has an as-deposited thickness and wherein, after said etching process is performed, said exposed substantially vertically oriented portions of said metal layer has a post-etch thickness that is 50% or less of said as-deposited thickness.

18. The method of claim 13, wherein said metal layer has an as-deposited thickness that falls within the range of about 4-5 nm, and wherein, after said etching process is performed, said exposed substantially vertically oriented portions of said metal layer has a post-etch thickness that is within the range of about 1-2 nm.

19. A method of forming a transistor, comprising:
   forming a sacrificial gate structure above a semiconducting substrate;
   removing said sacrificial gate structure to thereby define a gate cavity for a replacement gate structure;
   depositing a high-k gate insulation layer in said gate cavity;
   performing an atomic layer deposition (ALD) process to form a metal layer above said high-k gate insulation layer, said metal layer having substantially vertically oriented portions positioned within said gate cavity;
   forming a layer of etch mask material on said metal layer such that an as-deposited thickness of a substantially horizontally oriented portion of said layer of etch mask material that is positioned above a bottom of said gate cavity is greater than an as-deposited thickness of substantially vertically oriented portions of said layer of etch mask material positioned adjacent said substantially vertically oriented portions of said metal layer;
   performing a first wet etching process to remove at least portions of said substantially vertically oriented portions of said layer of etch mask material to thereby form a patterned etch mask layer above said metal layer, wherein said patterned etch mask layer exposes said substantially vertically oriented portions of said metal layer within said gate cavity and covers a substantially horizontally oriented portion of said metal layer that is positioned within said gate cavity;
   performing a second wet etching process through the patterned etch mask layer to reduce a thickness of said exposed substantially vertically oriented portions of said metal layer such that a thickness of said substantially vertically oriented portions of said metal layer is less than an as-deposited thickness of said horizontally oriented portion of said metal layer;
   performing a third wet etching process to remove said patterned etch mask layer; and
   forming a conductive material in unfilled portions of said gate cavity.

20. The method of claim 19, further comprising performing at least one chemical mechanical polishing process to remove portions of said gate insulation layer, said metal layer and said conductive material to thereby define said replacement gate structure.

21. The method of claim 19, wherein, after said second etching process is performed, said exposed substantially vertically oriented portions of said metal layer has a post-etch thickness that is 50% or less than said as-deposited thickness of said horizontally oriented portion of said metal layer.

22. The method of claim 19, wherein said as-deposited thickness of said horizontally oriented portion of said metal layer falls within the range of about 4-5 nm, and wherein, after said second etching process is performed, said exposed substantially vertically oriented portions of said metal layer has a post-etch thickness that is within the range of about 1-2 nm.

\* \* \* \* \*